United States Patent
Rissetto

(10) Patent No.: US 7,428,178 B2
(45) Date of Patent: Sep. 23, 2008

(54) MEMORY CIRCUIT CONTAINING A CHAIN OF STAGES

(75) Inventor: Leonardo Valencia Rissetto, Montbonnot (FR)

(73) Assignee: STMicroelectronics SA, Montrouge (FR)

( * ) Notice: Subject to any disclaimer, the term of this patent is extended or adjusted under 35 U.S.C. 154(b) by 19 days.

(21) Appl. No.: 11/398,491

(22) Filed: Apr. 5, 2006

(65) Prior Publication Data

US 2006/0262588 A1    Nov. 23, 2006

(30) Foreign Application Priority Data

Apr. 5, 2005  (FR) .................................. 05 03351

(51) Int. Cl.
*G11C 7/00* (2006.01)

(52) U.S. Cl. .................................. 365/189.12; 365/239

(58) Field of Classification Search ............ 365/189.12, 365/239, 240; 377/75; 345/213
See application file for complete search history.

(56) References Cited

U.S. PATENT DOCUMENTS 5,410,583 A  *  4/1995  Weisbrod et al. ............... 377/75

FOREIGN PATENT DOCUMENTS

JP           325798         4/2002

OTHER PUBLICATIONS

Preliminary Search Report dated Dec. 7, 2005 for French Patent Application No. 0503351.

* cited by examiner

*Primary Examiner*—Vu A Le
(74) *Attorney, Agent, or Firm*—Lisa K. Jorgenson; Stephen Bongini; Fleit Gibbons Gutman Bongini & Bianco P.L.

(57) ABSTRACT

A memory circuit is provided that includes at least one chain of at least three stages each having a data input, a data output, and a control signal input. Each of the stages between the first stage and the last stage includes a first NMOS transistor having a gate connected to the control signal input of the stage, and a second NMOS transistor having a gate connected to the data input of the stage. The first and second NMOS transistors are serially connected between a first potential and a second potential, with the common electrode of the transistors being connected to the data output of the stage. The data input of the stage is connected to the data output of a preceding one of the stages, and the data output of the stage is connected to the data input of a following one of the stages. Also provided are writing and reading processes for such a memory circuit.

20 Claims, 6 Drawing Sheets

| Number of stages | coded bits | Number of stages | Coded bits |
|---|---|---|---|
| 5 | 3 | 15 | 9 |
| 6 | 3 | 31 | 21 |
| 7 | 4 | 47 | 32 |
| 8 | 5 | 63 | 43 |
| 9 | 5 | 127 | 87 |

MEMORY CIRCUIT CONTAINING A CHAIN OF STAGES

CROSS-REFERENCE TO RELATED APPLICATIONS

This application is based upon and claims priority from prior French Patent Application No. 05 03351, filed Apr. 5, 2005, the entire disclosure of which is herein incorporated by reference.

FIELD OF THE INVENTION

The present invention relates to storage circuits, and in particular to a dynamic type memory circuit that allows dense integration.

BACKGROUND OF THE INVENTION

The development of information technology has resulted in a significant increase in the need for data storage.

The state of the art comprises a number of memory circuits, and in particular volatile memory. Due to the increased need for data storage in nearly any application, it is required to get a large set of memory circuits in order to satisfy these needs.

Typically one distinguishes memories as a function of the nature of the memory cell. In static memories, the memory cell retains information to be stored without time limitation, where with dynamic memories information retention is transitory and needs to be periodically refreshed. One classifies memory circuits as a function of the particular architecture which the memory cell uses and, in particular, single port memory, double port memory, FIFO (first in first out) memory, and also shift registers.

The more recent applications call for high density and cheap memory circuits.

Miniaturization of electronic circuits is a first step toward the increase of the density of memory circuits.

Nevertheless, it is desirable to provide memory circuits using a limited set of transistors for every memory cell, as well as an optimal micro architecture of these transistors. That will also enable an increase in the circuit density.

Memories that are built in an array are well known and used because they allow individual addressing of each memory cell.

Shift register memories have limited use compared to memory arrays, but they offer a higher level of integration because their access is decreased so the required resources to implement the access are decreased.

That difference explains the better memory density of non-volatile memory based on a NAND architecture compared to those based on a NOR architecture.

FIG. 1 shows a conventional structure of a shift register memory as described in U.S. Pat. No. 5,806,084. That structure is based on a shift register made of a cascade of memory elements or buffers connected one to another. FIG. 1 illustrates two buffer circuits 11 and 12, generally made of inverters, separated by propagation transistors 13 and 14 that are used to control propagation of information from one circuit to the other. Such a memory structure is operated as follows. When for example propagation transistor 13 is closed, stage 12 is then connected to the previous one, which achieves the propagation of information from stage 11 to stage 12. When propagation transistor 13 is open, stage 12 is then disconnected from the previous one and behaves like an information retention point that keeps that information during a period of time that is a function of the internal capacity of that circuit.

This memory structure requires a set of 3 transistors per elementary stage, with two of opposite type (inverters are typically made of two MOS transistors of opposite types, P and N, each with specific sources and drains).

That represents a limitation in density increase and it is desirable to solve that problem and reduce further the obstruction of each elementary stage.

SUMMARY OF THE INVENTION

It is an object of the present invention to provide a memory circuit structure based on a series of stages that each have a limited number of components and allow easy integration.

Another object of the present invention is to provide a memory circuit for volatile memory that is particularly dense in integration and has reduced manufacturing costs.

These objects are achieved in one embodiment by a memory circuit that includes a chain of elementary stages, each having a data input, a data output, and a control input. In this embodiment, each stage consists of two NMOS transistors series-connected between a first potential and a second potential, with the middle point being connected to the data output electrode. The gate of the first transistor receives a propagation control signal for the stored information while the gate of the second transistor is used the data input point of the stage. The memory circuit uses a particular coding of stored information so as to avoid having two consecutive logical 1's stored in the storage chain. Further embodiments of the present invention provide writing and reading processes for such a memory circuit.

Using that specific coding prevents two consecutive logical 1's in the same memory, so each stage can be realized with two MOS transistors of the same type, for example N.

Moreover, these two transistors being of same type, one significantly reduces the space required, and they can also share the same substrates to realize the sources and drains of the two transistors in the same stage.

Another embodiment of the present invention provides a memory circuit having a series of stages, each constituted by two PMOS transistors series-connected between two potentials. A first transistor comprises a gate receiving an input signal, which is the output signal of the preceding stage, while a second transistor receives a propagation control signal that controls the propagation of the stored information. The circuit comprises a particular coding of information to avoid storage of two consecutives logical 0's in the same chain of storage.

Control logic achieves the generation of the series of control signals in order to position a bit of information at the input of the chain for a given stage within the chain of stages.

In one preferred embodiment, the memory circuit comprises a multiplexer circuit having a first input that receives the information to store, a second input that receives the output of the last stage of the chain of stages, and a control input that allows the control of a shift operation of the stored information in open or closed loop.

Preferably, several chains of storage are arranged in parallel, and simultaneously monitored by the same control signals.

A further embodiment of the present invention provides a writing process in a memory circuit having a code that enables the coding of stored information in order to prevent two consecutives logical 1's. According to the writing process, information to be stored in the circuit is coded according to a given code, and a bit of information to be stored within the circuit is presented in its true or inverse form depending on its even or odd row. Control signals of each stage of the circuit are provided so as to position successively each bit of information at a given stage of the first block, there is performed a successive shift operation to allow the shift of information from one block to another block.

Yet another embodiment of the present invention provides a reading process in a memory circuit having a code that enables the coding of stored information in order to prevent two consecutive logical 1's. According to the reading process, there are performed one or several shift operations of information from one block to another in order to present the information to read in the last block of the memory circuit. Control signals of each stage of the circuit are provided so as to successively read each bit of information at the output of the memory circuit. Bits in odd rows are inverted, and information is decoded in order to restore the original information.

The present invention is particularly adapted to realization of a FIFO type memory.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

There will now be described, with reference to FIG. 2a, a memory circuit according to a preferred embodiment of the present invention that is realized with NMOS type transistors.

The circuit comprises a shift register or storage chain comprising a series of elementary stages, such as stage 20. Stage 20 comprises a set of two NMOS transistors 21($i$) and 22($i$) whose sources and drains are serially connected between a first reference potential Vcc and a second reference potential Vss. Transistor 22($i$) has its source connected to potential Vss while the drain of transistor 21($i$) is connected to potential Vcc. The gate of transistor 21($i$) receives a control signal EN(i) (i.e., "Enable") while the gate of transistor 22($i$) is connected to the output of the preceding stage and receives an input signal IN(i). The common electrode between the two transistors 21($i$) and 22($i$) generates the output signal of stage 20 which is transmitted to the downstream stage. For clarity, in the diagram of FIG. 2 there is shown the upstream stage as well as the downstream stage of stage 20. As shown, the upstream stage comprises two NMOS transistors 21($i$−1) and 22($i$−1) whose sources and drains are serially connected between the two potentials Vcc and Vss, and whose common electrode 23($i$−1) is connected to the gate of transistor 22($i$) of stage 20. The downstream stage comprises NMOS transistors 21($i$+1) and 22($i$+1) serially connected between the two potentials Vcc and Vss with the common electrode 23($i$+1) connected to the gate of the following transistor.

Figures 1, 3:
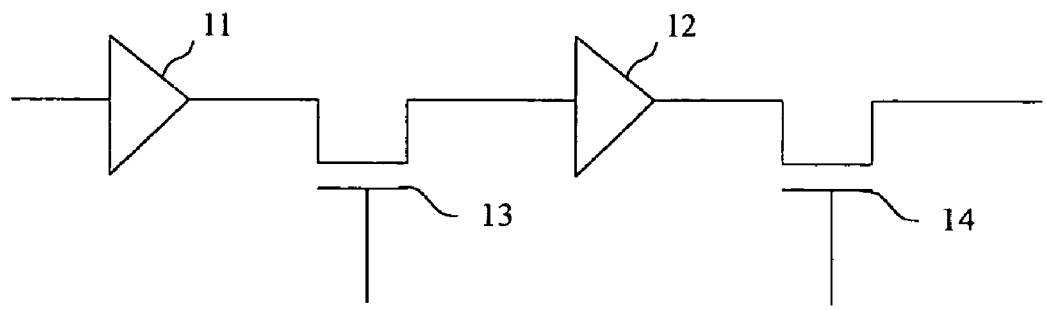
FIG. 1 illustrates a conventional serial structure of a memory circuit.
FIG. 3 shows the correspondence between the number of stages of a memory circuit according to a preferred embodiment of the present invention and the number of stored bits.
Figure 2A:
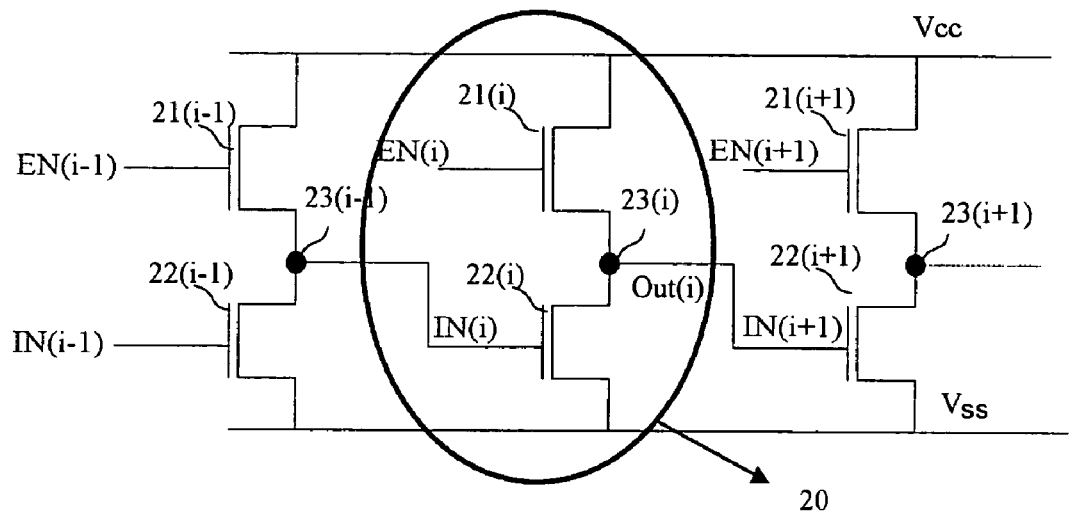
FIG. 2a illustrates a memory cell in a circuit according to a preferred embodiment of the present invention that is realized with NMOS type transistors.

The circuit of FIG. 2a comprises a series of elementary stages, each identical to stage 20, which are connected to one another. The overall circuit thus constitutes a shift register functionally equivalent to the one shown in FIG. 1. But different from FIG. 1, each stage is made of only two transistors, which are of the same type.

That is a considerable difference, as it modifies the behavior of each stage, it brings significant advantages.

First, there is no longer a need for the propagation control transistors (13 and 14 in FIG. 1).

Second, the use of two transistors of the same type allows a reduction in the surface area used for each elementary stage on the silicon substrate. Indeed, the two transistors can be placed very close to each other on the same silicon substrate because there are from same type, P or N. Moreover, the sources and drains of the two transistors of the same stage can be shared, allowing them to be brought closer on the of silicon substrate.

Thus, the present invention enables the fabrication of a particularly dense memory structure. In comparison, an inverter stage comprising two MOS transistors of N and P type would occupy a surface approximately equal to 4 times the surface of a single MOS transistor, while an elementary stage of FIG. 2a is limited to only about two transistors.

It therefore provides a significant advantage when integrating a large number of memory cells in a semiconductor substrate.

There will now be described the operation of the shift register of FIG. 2a. For clarity, there will be adopted the convention of associating a logical 1 with a positive potential close to Vcc. Clearly, this is just an arbitrary choice and an opposite logic could be chosen.

In the circuit of FIG. 2a, the electrodes of transistor gates 21($i$−1), 21($i$), 21($i$+1), and so on (i.e., control signals EN(i−1), EN(i), EN(i+1), and so on) enable a control of propagation in the shift register, but that control is not complete.

Indeed, the logical operation of stage 20 is as follows.

If IN(i)=1 and EN(i)=1, then the output OUT (i)=0.

If IN(i)=0 and EN(i)=1, then the output OUT (i)=1.

If IN(i)=0 and EN(i)=0, then the output OUT (i) is in retention.

If IN(i)=1 and EN(i)=0, then the output OUT (i)=0.

When the two signals IN(i) and EN(i) are equal to 1 (close to the positive potential Vcc), transistor 21($i$) conducts less perfectly than transistor 22($i$) and by consequence, the output potential on the common electrode of these two transistors is a logical 0.

When the two signals IN(i) and EN(i) are in a logical state 0 (close to the ground potential Vss), then stage 20 is in state of information retention and the output potential is the one fixed by the preceding value. That preceding value is maintained during a time that is determined by the value of the internal capacities of the two transistors.

Thus, stage 20 is behaving when EN(i)=1 like an inverter to IN(i), and when the couple EN(i) and IN(i) is equal to 0 like a retention point of a bit of information.

One notes that the set of stages, comprising stage 20 as well as stages upstream and downstream, achieves a shift register, which serves as a storage chain that is imperfectly controlled by the control signals EN(i). In particular, when IN(i)=0, control signal EN(i) enables the propagation of that signal 0. On the other hand, the signal IN(i)=1 is propagated indifferently to the value taken by control signal EN(i).

From that observation, it can be seen that the shift register of FIG. 2a cannot be directly used to store any sequence because, even by fixing EN(i)=0 for all values of i, bits fixed at 1 in a given stage will be automatically reflected at the input of the following stage and will erase the stored value if it is not a 0.

Embodiments of the present invention solve this problem by using a specific coding of information in order to guarantee that a logical 1 is always followed by a 0 or, in other terms, to exclude the presence of two consecutive logical 1's in the storage chain.

Thanks to this coding feature, it is possible to realize a complete shift register that realizes the function of storage chain, made of n stages, that allows storage of information in response to control signals EN(i), for i=0 to n.

The particular choice of the code is arbitrary as long as it follows the constraint of avoiding two consecutive 1's in the storage chain. If for example words of 4 bits only are considered, it is observed that only words 1010, 1000, 0100, and 0010 can be stored in the storage chain. On the other hand, the words 1100, 0110, 0011, 0001, 1110, 0111, 1101, 1011, 0101, 1001, 0001, and 1111 cannot be stored.

The simplest coding consists, for a given number of stages in the chain, in identifying all words that cannot be stored in the chain because of the systematic propagation of logical 1's. Once there are identified the words that can be stored in the same storage chain, it will then be enough to realize a conversion or translation of original information to store—that could be unspecified—and coded information (with previously mentioned constraints) that must be stored in the storage chain taking into consideration the inversions operated from one stage to another.

Figure 4:
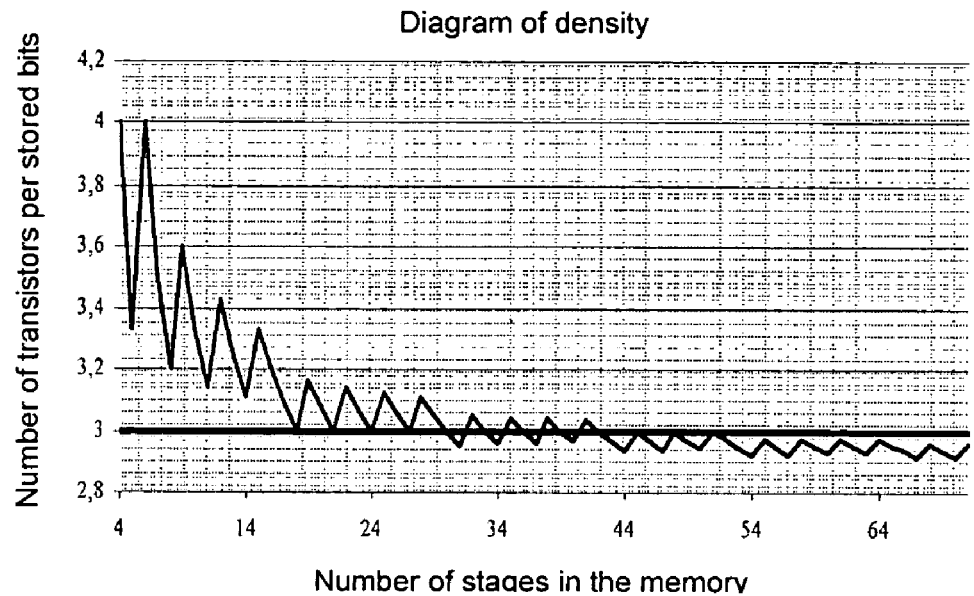
FIG. 4 illustrates the density curve of a memory according to a preferred embodiment of the present invention as a function of the number of stages.

FIG. 3 provides a correspondence between the number of bits that can be coded and the number of stages in the storage chain. It is noted that, for a storage chain of only 5 stages, information coded on 3 bits can only be stored. As the number of stages increases, the number of bits of information that can be stored significantly increases, and that enables an increase in the density curve representative of the number of transistors per stored bit, as shown by the curve illustrated in FIG. 4. As shown, from 40-50 stages, the curve goes below the conventional value of 3 transistors per stage. Thus, the storage chain according to the present invention, with the help of the intervention of the previously mentioned coding, can store the same information using less transistors than the conventional circuit of FIG. 1.

Moreover, the allocated surface on the silicon substrate is particularly reduced because each stage is made of two transistors of the same type, for example two NMOS transistors. That is a considerable advantage because, on average, a set of an NMOS transistor and a PMOS transistor occupies a surface that is about two times more than the surface taken up by two NMOS type transistors.

There will now be briefly described a preferred embodiment made up of PMOS type transistors.

Figure 2B:
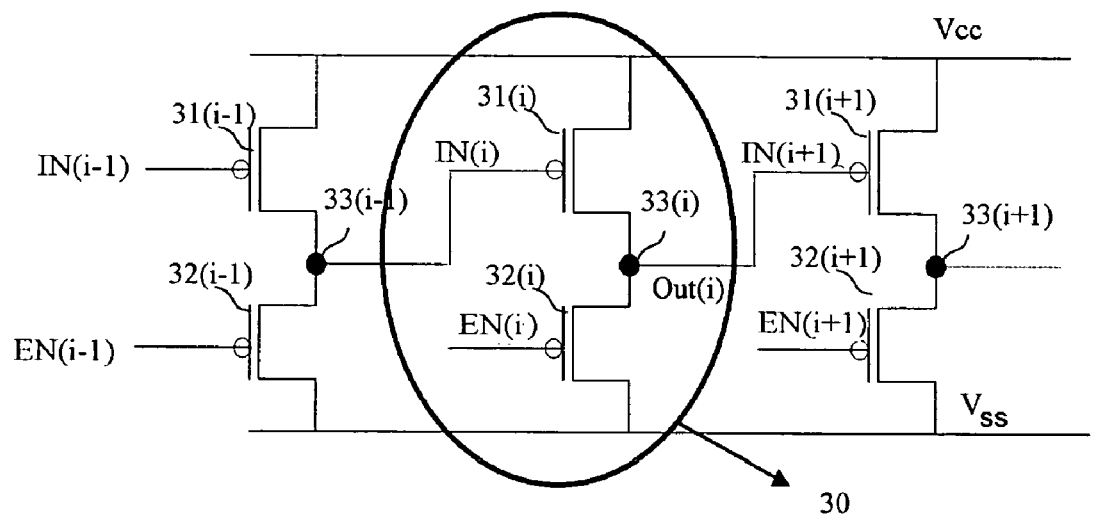
FIG. 2b illustrates a memory cell in a circuit according to a preferred embodiment of the present invention that is realized with PMOS type transistors.

FIG. 2b illustrates such an embodiment. Elements 20, 21, 22 and 23 of FIG. 2a are respectively indicated under the references 30, 31, 32 and 33 in FIG. 2b. Noting the differences, stage 30 comprises two PMOS transistors 31(i) and 32(i) whose sources and drains are connected between potential Vcc and potential Vss. Transistor 31(i) has its source connected to potential Vcc while the drain of transistor 32(i) is connected to potential Vss. The drain of transistor 31(i) and source of transistor 32(i) are connected to the output OUT 33(i). The gate of transistor 32(i) is connected to the output of the preceding stage and receives the input signal IN(i). The common electrode 33(i) between the two transistors 31(i) and 32(i) generates the output signal from stage 30 which is transmitted to the downstream stage.

Similarly to the structure made with NMOS transistors, the upstream stage comprises a PMOS transistor 31(i−1) and a PMOS transistor 32(i−1) whose gates receive signals IN(i−1) and EN(i−1), respectively. Transistor 31(i−1) comprises a source connected to potential Vcc and a drain connected to the output electrode 33(i) of the upstream stage. Transistor 32(i−1) comprises a drain connected to potential Vss and a source connected to output electrode 33(i).

Then, the downstream stage comprises a PMOS transistor 31(i+1) and a transistor PMOS 32(i+1); the gates of which respectively receive signals IN(i+1) and EN(i+1). Transistor 31(i+1) comprises a source connected to potential Vcc and a drain connected to the output electrode 33(i+1) of the upstream stage. Transistor 32(i+1) comprises a drain connected to potential Vss and a source connected to output electrode 33(i).

In the structure of FIG. 2b, the control signal EN(i) allows, when at a logical level 0, to ensure the propagation of logical 1 according to the following.

If IN(i)=0 and EN(i)=0, then the output OUT (i)=1.

If IN(i)=1 and EN(i)=0, then the output OUT (i)=0 (propagation ordered by EN(i)).

If IN(i)=0 and EN(i)=1, then the output OUT (i)=1 (propagation).

If IN(i)=1 and EN(i)=1, then the output OUT (i) is in retention.

Thus, in this embodiment, the propagation of 0 cannot be ordered by control signal EN(i) so a coding of information is required to avoid two consecutive 0's in the storage chain.

In the following description it is assumed that each elementary stage is made of two NMOS type transistors and that potential Vcc is a positive potential and potential Vss is a negative potential or ground. Clearly, one of ordinary skill in the art will be able to adapt the following description to realize a shift register based on PMOS type transistors and, by consequence, the realization of a memory structure comprising such a shift register.

Figure 7:
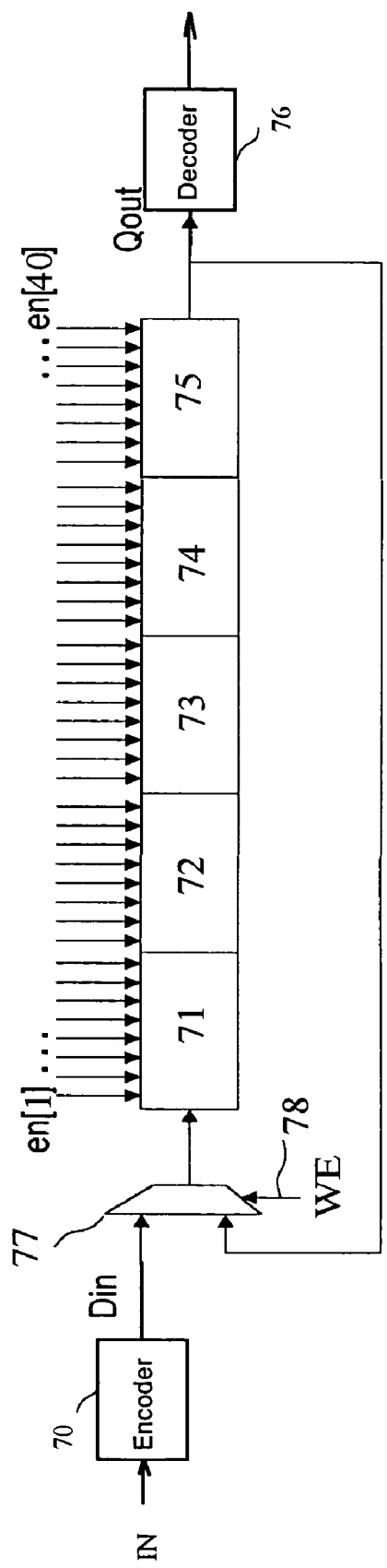
FIG. 7 illustrates a memory circuit according to an embodiment of the present invention.

FIG. 7 illustrates a memory circuit comprising a storage chain as described above with respect to FIG. 2. In this exemplary embodiment, the storage chain is made of 40 stages and the selected code is an 8 bit code that allows the storage of 5 bytes. The memory is by consequence divided into five groups (or blocks) 71, 72, 73, 74, and 75, each comprising 8 elementary stages as described above with respect to FIG. 2. Group 71 is made of 8 stages (also illustrated by elements 51-58 of FIG. 5) that receive propagation signals EN(1), EN(2) . . . EN(8), respectively. Similarly, group 72 comprises 8 stages that receive signals EN(9)-EN(16), etc.

The memory circuit of FIG. 7 comprises a coding circuit 70 with an input that receives information to be stored in a serial form. Encoder 70 has an output Din that is connected to a first input of a multiplexer 77, whose output is connected to the input of the storage chain 71-75, and more specifically at the input of the first stage of the first block of that chain.

That same storage chain has an output—that is the output of the 40$^{th}$ stage—which is connected to a second input of the multiplexer 77 as well as to the input of a decoder circuit 76 used to realize the decoding operation that is reverse to the coding operation made by encoder 70.

At the output of decoder 76, the information that was initially introduced into the memory is retrieved in serial form.

Multiplexer 77 is controlled by signal WE (write enable) that determines if the output of the encoder 70 or of the storage chain 71-75 is supplied to the input of that chain.

There will now be described the operation of the storage chain in accordance with embodiments of the present invention, which includes a process comprising the phases of writing, block shift, and reading.

Writing Phase

Figure 5:
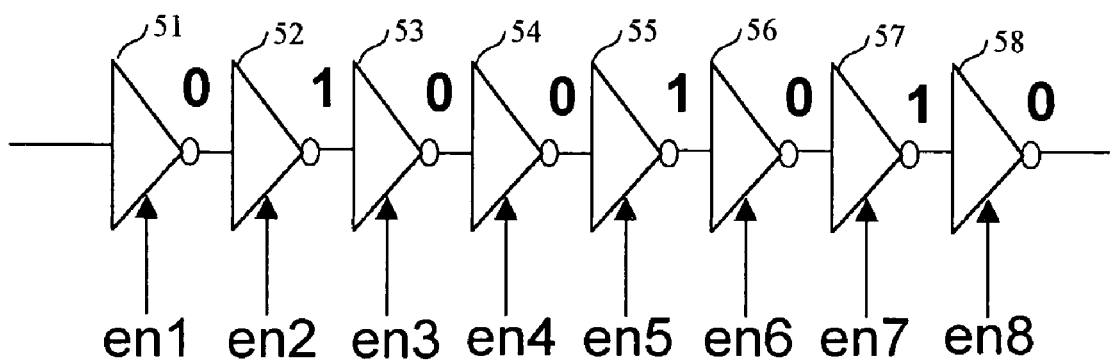
FIG. 5 illustrates a group of eight stages used to store the coded value 01001010.

There will first be considered a writing operation in group 71 of the storage chain 71-75, and more specifically the storage of information that, once encoded by encoder 70, is "01001010". That sequence of logical levels corresponds to the real content of the series of 8 stages 51-58 (of N type), as illustrated in FIG. 5.

To this end, at the input of the storage chain there is introduced information Din using multiplexer 77 controlled by a logical signal WE=1. Taking into account that there are produced inversions at each odd row (rank) of the storage chain, there is presented at the input of multiplexer 77 information Din equal to "1110000", which corresponds to a value b1 b2 b3 b4 b5 b6 b7 b8=01001010 effectively stored in the storage chain.

Writing of bits b1 b2 b3 b4 b5 b6 b7 b8 in the storage chain is realized by 8 elementary operations that allow there to be positioned successively at the input of multiplexer 77 each of the bits of information Din=1110000.

In a first period, the process performs the storage of bit b8=0 in stage 58. To this end, control signals EN(1)-EN(8) are set to 1 and the value of b8 is presented at the input of block 71 in order to allow the propagation of information up to the 8$^{th}$ position of block 71.

In a second period, the values EN(1)-EN(7) are set to 1 and the inverse value of B7 is presented at the input of block 71 of registers 51-58. That inverse value allows there to be stored value b7 in stage 57 because this information goes through an odd number of inverters. If the information stored in stage 57 is a logical 1, this means that this value will automatically be propagated up to the next stage and refresh the logical 0 already stored there because the coding used avoids the presence of two consecutive logical 1's. If the stored value in stage 57 is a 0, then propagation of that value is automatically stopped because, by hypothesis, control signal EN(8) is fixed at a low level (state).

The process then similarly proceeds so as to successively store each of the six bits b1 b2 b3 b4 b5 b6 in the corresponding stages 51-56, with the control signals EN(1)-EN(8) guaranteeing the correct positioning of each bit of information at its right place.

The writing operation is terminated with the storage of the last bit b1. At this moment, we have stored in the eight stages 51-58 the eight bits b1 b2 b3 b4 b5 b6 b7 b8.

The writing process that has been described in detail, which allows storage of coded information, can be summarized by the following steps:

coding of information to be stored in the circuit according to the code;
generating information to be presented at the input of the storage chain, with the introduction of an inversion according to an even or odd row (rank);
presenting information at the input of the storage chain;
providing a control signal to each stage of the circuit in order to successively position each bit of information at a particular stage of the first block; and
performing successive shift operations to move information from one block to another.

Shifting Phase

Once the writing operation has been performed, the process continues with one or several internal shift operations in the storage chain in order to shift the contents of the first block 71 (comprising stages 51-58) into block 72 in order to release block 71 and allow a later writing operation in this block.

In a preferred embodiment, that operation of internal shift is realized by keeping the loop open (open loop shift), that is by maintaining the control signal for the multiplexer 77 at logical 1.

The process then realizes a sequencing of signals EN(9)-EN(16) in order to position, successively, each of the bits b1 b2 b3 b4 b5 b6 b7 b8 at their respective place in block 72. For clarity, we will briefly describe the operation.

In a first phase, the process generates a logical 1 on control signals EN(9)-EN(16), which automatically transfers the content of stage 58 (in fact b8) into the 8$^{th}$ stage of block 72.

In a second phase, the process generates a logical 1 on control signals EN(8)-EN(15), which automatically transfers the content of stage 57 (in fact b7) into the 7$^{th}$ stage of block 72.

The process then successively transfers the contents of each of the stages 51-58 by appropriate control of signals EN(1)-EN(16). Unlike the writing process described previously, it is not necessary to contemplate a data inversion when going from one block to another (from block 71 to block 72 in our example), because each of the bits b1 b2 b3 b4 b5 b6 b7 b8 keeps the same row (rank) in the new block.

It can thus be seen that the shift operation can be achieved very easily to carry out a shift from block 71 to block 72.

The same process is used for any internal shift in the storage chain 71-75 of FIG. 7.

The shift phase could also be a shift phase in closed loop, which is realized by simply commuting the multiplexer 77 command by the control signal WE.

In this shift phase in closed loop (CLS), the process realizes a transfer of contents from the last block 75 into the first block 71 in order to allow a circular shift in the storage chain.

This transfer is realized by eight consecutive transfer operations of each of the bits stored in block 75 by ordering (controlling) in an appropriate manner signals EN(33)-EN(40) and also signals EN(1)-EN(8).

Reading Phase

The reading operation is similar to the shift operation in open loop because it consists in realizing a shift on the last block of the chain, which is block 75. This allows the successive presentation, at the output of the last stage of block 75, of each of the bits b1 b2 b3 b4 b5 b6 b7 b8 that were initially stored in the storage chain.

To this end, there is realized a first reading of the 8$^{th}$ stage of block 75, which is done directly. That value b8 is then transmitted to decoder 76.

In a second phase, there is realized a transfer of the content of the 7$^{th}$ stage of block 75 (that is b7) into the 8$^{th}$ stage of that same block, by activating signal EN(40).

In a third phase, there is realized a transfer of the content of the 6$^{th}$ stage of block 75 into the 8$^{th}$ stage of the same block, by activating signals EN(39)-EN(40). Value b7 is then transmitted to decoder 76.

The process proceeds further up to the reading of eight stored bits b1 b2 b3 b4 b5 b6 b7 b8. Once the reading is done, data is transmitted to decoder 76 that can then decode this value, taking into account inversions performed on bits from odd rows and the coding used to exclude the presence of two consecutive logical 1's in the storage chain 71-75.

All of the writing, reading and internal shifting operations which were described do contribute to refreshing the memory cells in the chain 71-75. That is another effect of the present invention that is particularly advantageous to allow, without additional mechanisms classically required for DRAMs for example, an automatic refresh of the memory cells.

Further, information to be read has already been "brought" closest to the output, which means a very fast availability of data in comparison with a matrix memory structure in which information needs to be conveyed toward the output, which is exactly what requires most time in these matrix memories.

The reading process that has been just described can be summarized by the following steps:

performing one or several shift operations to shift information from one block to another in order to present information to be read in the last block of the memory circuit;

providing a control signal of each stage of the circuit in order to read successively each bit of information at the output of the memory circuit;

inverting bits from odd rows; and decoding information in order to restore the original information.

Figure 6:
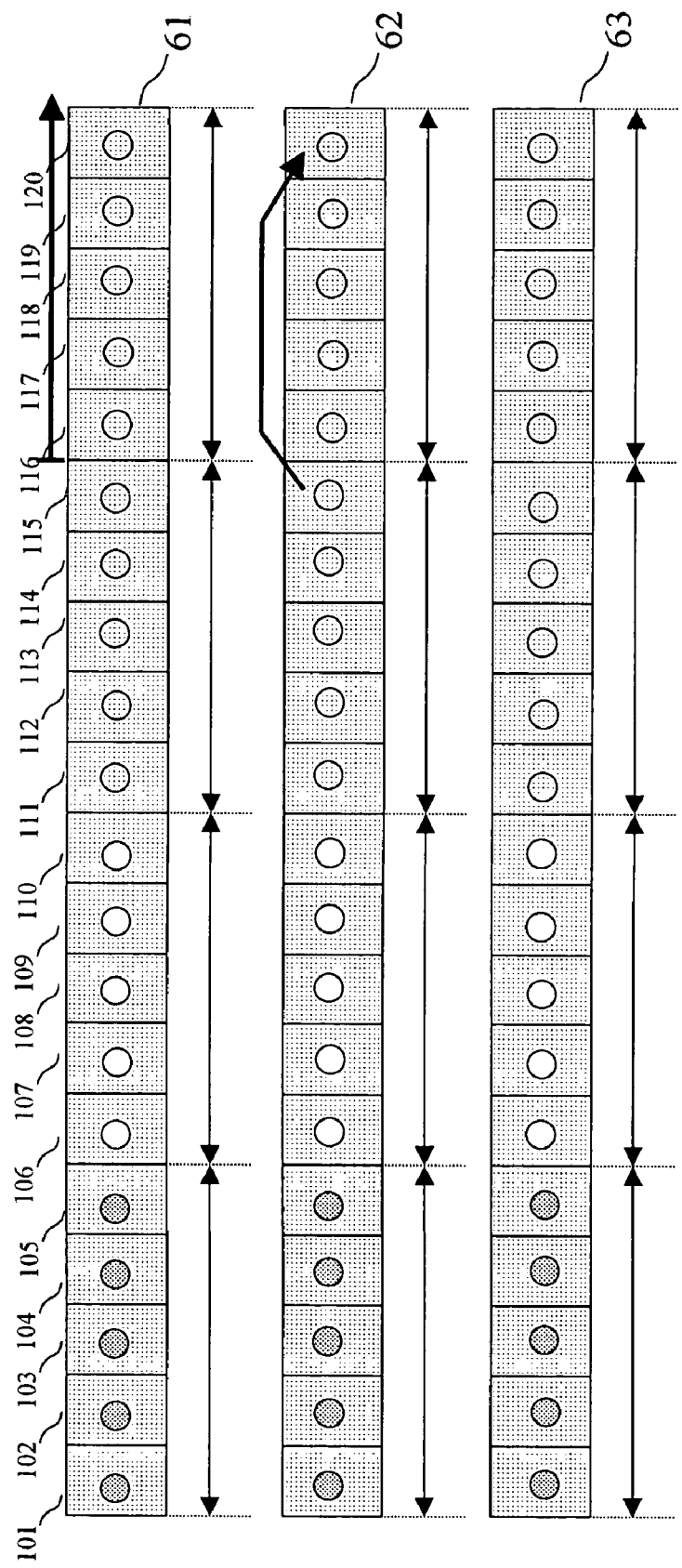
FIG. 6 illustrates the recording and shifting process of a data group.

FIG. 6 illustrates another embodiment of the present invention in which stages 101-120 are arranged in blocks of 5 stages each (i.e., 101-105, 106-110, 111-115, and 116-120), which corresponds to a code length of 5. Reference 61 of FIG. 6 illustrates the reading operation in the memory based on a shift performed on the last block of that memory, while reference 62 shows a shift operation to transfer the contents of stage 115 to stage 120 of the last block.

Figure 8:
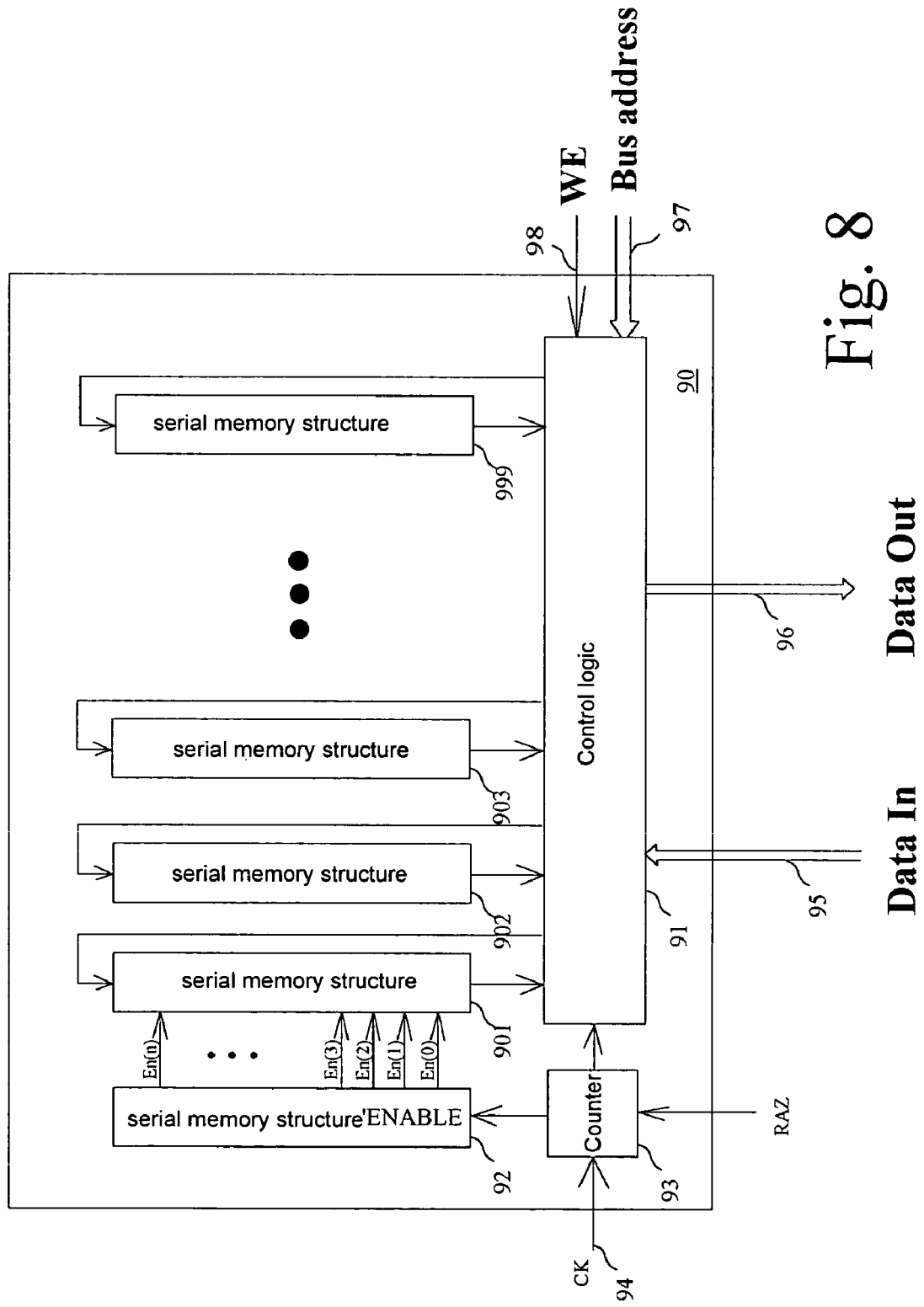
FIG. 8 illustrates the architecture of a memory circuit comprising a setting in parallel of distinctive chains.

While there has just been described the operation of a storage chain according to a preferred embodiment of the present invention, there can advantageously be put in parallel several such storage chains controlled by the same signals EN(1)-EN(n). FIG. 8 illustrates a memory circuit comprising an exemplary implementation of distinct parallel storage chains 901, 902, 903, and 999 in the same circuit 90.

This circuit comprises in particular control logic 91 which is connected to an input bus of data 95, to an output bus of data 96, to an addresses bus 97 that receives conventional control signals, and to control signal WE (WRITE ENABLE). The control logic 91 is connected to the input and the output of storage chains 901-999, which can be identical to those described above with reference to FIG. 7. Encoder circuits 70 and decoder circuits 76 can be integrated inside control logic 91.

This circuit comprises moreover logic 92 for the generation of control signals EN(0)-EN(n), which receives the value from a counter 93 that receives a clock signal at an input 94 as well as a RAZ signal that is also transmitted to logic 91.

Control logic 91 provides the interface of different storage chains, as defined above, with the outside, while logic 92 realizes control signal generation in order to enable successively writing, reading, and shifting operations that are required by the storage chains.

There has been described the operation of a memory circuit in conformance with the present invention. This memory circuit can be used to realize multiple interfaces, in particular a FIFO type circuit, a memory with random access, and so on.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A memory circuit comprising at least one chain of at least three stages each having a data input, a data output, and a propagation control signal input for controlling propagation of information from the data input to the data output, each of the stages between the first stage and the last stage comprising:

a first NMOS transistor having a source, a drain, and a gate connected to the propagation control signal input of the stage so as to receive a propagation control signal that controls propagation of information from the data input to the data output of the stage; and a second NMOS transistor having a source, a drain, and a gate connected to the data input of the stage, wherein the first and second NMOS transistors are serially connected between a first potential and a second potential, the common electrode of the transistors being connected to the data output of the stage, the data input of the stage is connected to the data output of a preceding one of the stages, and the data output of the stage is connected to the data input of a following one of the stages.

2. A memory circuit comprising at least one chain of at least three stages each having a data input, a data output, and a control signal input, each of the stages between the first stage and the last stage comprising:

a first NMOS transistor having a source, a drain, and a gate connected to the control signal input of the stage;

a second NMOS transistor having a source, a drain, and a gate connected to the data input of the stage; and an encoder for coding information to be stored in the memory circuit so as to prevent storage of two consecutive 1's in the chain of stages, wherein the first and second NMOS transistors are serially connected between a first potential and a second potential, the common electrode of the transistors being connected to the data output of the stage, the data input of the stage is connected to the data output of a preceding one of the stages, and the data output of the stage is connected to the data input of a following one of the stages.

3. The memory circuit according to claim 1, further comprising a circuit for generating the propagation control signals, the propagation control signals being coupled to the propagation control signal inputs of the stages so as to allow positioning of a bit of information at a specific stage in the chain of stages.

4. The memory circuit according to claim 1, further comprising a multiplexer having a first input that receives information to be stored, a second input coupled to the data output of the last stage of the chain of stages, and a control input for controlling a shift operation in open or closed loop.

5. The memory circuit according to claim 1, wherein the memory circuit comprises at least two chains that are simultaneously controlled by the same propagation control signals.

6. A memory circuit comprising at least one chain of at least three stages each having a data input, a data output, and a propagation control signal input for controlling propagation of information from the data input to the data output, each of the stages between the first stage and the last stage comprising:
- a first PMOS transistor having a source, a drain, and a gate connected to the data input of the stage; and
- a second PMOS transistor having a source, a drain, and a gate connected to the propagation control signal input of the stage so as to receive a propagation control sianal that controls propagation of information from the data input to the data output of the stage,
- wherein the first and second PMOS transistors are serially connected between a first potential and a second potential, the common electrode of the transistors being connected to the data output of the stage,
- the data input of the stage is connected to the data output of a preceding one of the stages, and
- the data output of the stage is connected to the data input of a following one of the stages.

7. A memory circuit comprising at least one chain of at least three stages each having a data input, a data output, and a control signal input, each of the stages between the first stage and the last stage comprising:
- a first PMOS transistor having a source, a drain, and a gate connected to the data input of the stage;
- a second PMOS transistor having a source, a drain, and a gate connected to the control signal input of the stage; and
- an encoder for coding information to be stored in the memory circuit so as to prevent storage of two consecutive 0's in the chain of stages,
- wherein the first and second PMOS transistors are serially connected between a first potential and a second potential, the common electrode of the transistors being connected to the data output of the stage,
- the data input of the stage is connected to the data output of a preceding one of the stages, and
- the data output of the stage is connected to the data input of a following one of the stages.

8. The memory circuit according to claim 6, further comprising a circuit for generating the propagation control signals, the propagation control signals being coupled to the propagation control signal inputs of the stages so as to allow positioning of a bit of information at a specific stage in the chain of stages.

9. The memory circuit according to claim 6, further comprising a multiplexer having a first input that receives information to be stored, a second input coupled to the data output of the last stage of the chain of stages, and a control input for controlling a shift operation in open or closed loop.

10. The memory circuit according to claim 6, wherein the memory circuit comprises at least two chains that are simultaneously controlled by the same propagation control signals.

11. A writing method for a memory circuit that includes at least one chain of at least three stages, each stage consisting of two serially connected transistors of the same type, with a gate of a first of the transistors being connected to a control signal input of the stage, a gate of a second of the transistors being connected to a data input of the stage, and the common electrode of the transistors being connected to a data output of the stage, the writing method comprising the steps of:
- coding information to be stored in the circuit according to a code that prevents storage of two consecutive 1's in the chain of stages or that prevents storage of two consecutive 0's in the chain of stages;
- presenting a bit of information to be stored in the circuit, the bit being presented in normal or inverted form depending on its row;
- providing control signals for each of the stages in order to successively position each bit of information in a given stage of a first block of stages; and
- performing successive shift operations to shift information from one block of stages to another block of stages.

12. The writing method according to claim 11, wherein the two transistors are NMOS transistors and the code prevents storage of two consecutive 1's in the chain of stages.

13. The writing method according to claim 11, wherein the two transistors are PMOS transistors and the code prevents storage of two consecutive 0's in the chain of stages.

14. The writing method according to claim 11, further comprising the step of providing a control signal for controlling the shift operation in open or closed loop.

15. A reading method for a memory circuit that includes at least one chain of at least three stages, each stage consisting of two serially connected transistors of the same type, with a gate of a first of the transistors being connected to a control signal input of the stage, a gate of a second of the transistors being connected to a data input of the stage, and the common electrode of the transistors being connected to a data output of the stage, the reading method comprising the steps of:
- performing at least one shift operation to shift information from one block of stages to another block of stages in order to present information to be read in the last block of stages;
- providing control signals for each of the stages in order to successively read each bit of information at an output of the memory circuit;
- inverting bits from even or odd rows; and
- decoding information stored in the circuit according to a code that prevents storage of two consecutive 1's in the chain of stages or that prevents storage of two consecutive 0's in the chain of stages.

16. The reading method according to claim 15, wherein the two transistors are NMOS transistors and the code prevents storage of two consecutive 1's in the chain of stages.

17. The reading method according to claim 15, wherein the two transistors are PMOS transistors and the code prevents storage of two consecutive 0's in the chain of stages.

18. The reading method according to claim 15, further comprising the step of providing a control signal for controlling the shift operation in open or closed loop.

19. The memory circuit according to claim 1, wherein the gate of the first NMOS transistor is not connected to the data input of the preceding one of the stages.

20. The memory circuit according to claim 1, wherein the gate of the first NMOS transistor is not connected to the first NMOS transistor or the second NMOS transistor of any of the other stages.

* * * * *

UNITED STATES PATENT AND TRADEMARK OFFICE
CERTIFICATE OF CORRECTION

| | |
|---|---|
| PATENT NO. | : 7,428,178 B2 |
| APPLICATION NO. | : 11/398491 |
| DATED | : September 23, 2008 |
| INVENTOR(S) | : Leonardo Valencia Rissetto |

Page 1 of 1

It is certified that error appears in the above-identified patent and that said Letters Patent is hereby corrected as shown below:

Col. 11, Claim 6, line 11, change "sianal" to --signal--.

Signed and Sealed this

Second Day of December, 2008

JON W. DUDAS
*Director of the United States Patent and Trademark Office*